(12) United States Patent
Kasai

(10) Patent No.: US 11,668,665 B2
(45) Date of Patent: Jun. 6, 2023

(54) SILICON HEATER BONDED TO A TEST WAFER

(71) Applicant: TOKYO ELECTRON LIMITED, Tokyo (JP)

(72) Inventor: Shigeru Kasai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 630 days.

(21) Appl. No.: 16/698,379

(22) Filed: Nov. 27, 2019

(65) Prior Publication Data

US 2020/0173942 A1 Jun. 4, 2020

(30) Foreign Application Priority Data

Nov. 29, 2018 (JP) .............................. JP2018-223959

(51) Int. Cl.
*G01N 25/18* (2006.01)
*H01L 23/34* (2006.01)
*H01L 23/36* (2006.01)
*H01L 23/00* (2006.01)

(52) U.S. Cl.
CPC ........... *G01N 25/18* (2013.01); *H01L 23/345* (2013.01); *H01L 23/36* (2013.01); *H01L 24/80* (2013.01); *H01L 2224/80009* (2013.01); *H01L 2224/80895* (2013.01)

(58) Field of Classification Search
CPC ....... G01N 25/18; H01L 23/345; H01L 23/36; H01L 24/80; H01L 21/31612
See application file for complete search history.

(56) References Cited

U.S. PATENT DOCUMENTS

| | | | |
|---|---|---|---|
| 6,943,037 B2* | 9/2005 | Anagnostopoulos | ...... B41J 2/03 347/62 |
| 2015/0158720 A1* | 6/2015 | Lim | ..................... B81C 1/00285 438/51 |
| 2015/0243800 A1* | 8/2015 | Shi | ..................... H01L 31/02327 438/91 |
| 2016/0155883 A1* | 6/2016 | Shi | ......................... H01L 31/028 257/186 |

FOREIGN PATENT DOCUMENTS

| | | |
|---|---|---|
| JP | H10-135315 A | 6/1998 |
| JP | 2008124199 A | 5/2008 |
| JP | 2008205456 A | 9/2008 |
| KR | 1020110088409 A | 8/2011 |

\* cited by examiner

*Primary Examiner* — Alonzo Chambliss
(74) *Attorney, Agent, or Firm* — Nath, Goldberg & Meyer; Jerald L. Meyer; Tanya E. Harkins

(57) ABSTRACT

A test wafer according to an embodiment of the present disclosure is a test wafer used for simulation of heat emission of devices on a wafer, and includes a silicon wafer and a silicon heater bonded to a surface of the silicon wafer.

9 Claims, 5 Drawing Sheets

Plasma-processing

Bonding
(hydrogen bond)

Heating
(dehydration reaction)

Covalent bond

SILICON HEATER BONDED TO A TEST WAFER

CROSS-REFERENCE TO RELATED APPLICATION

This application is based upon and claims the benefit of priority from Japanese Patent Application No. 2018-223959, filed on Nov. 29, 2018, the entire contents of which are incorporated herein by reference.

TECHNICAL FIELD

The present disclosure relates to a test wafer and a method for manufacturing the same.

BACKGROUND

In a semiconductor manufacturing process, a plurality of devices (IC chips) having a predetermined circuit pattern are formed on a semiconductor wafer (hereinafter, simply referred to as a wafer). The devices formed on the wafer are subject to inspections about their electric characteristics, etc. and are then classified into normal products and abnormal products. For example, in a wafer state before division of the devices, the inspection of the devices is performed by using an inspection device.

The inspection device includes a probe card having a plurality of pin-shaped probes, a loader on which a wafer is loaded, and a tester (see patent document 1). This inspection device inspects electrical characteristics of the device by bringing the probes of the probe card into contact with electrode pads or soldering bumps provided corresponding to the electrodes of the device, and by delivering a signal from the device to the tester. Further, the inspection device of patent document 1 is configured to control the temperature of a loader by using a refrigerant passage or a heater in the loader to realize a mounting environment of a device when the electrical characteristics of the device are inspected.

Recently, in the IC field, high speed and high integration have been pursued. As a result, heat emission from devices formed on a wafer has increased, and a method for heat absorption thereof has become an important technological issue. In the inspection device, in order to verify a heat absorption method, it is important to be able to test an actual heat emission situation of semiconductor devices.

PRIOR ART DOCUMENTS

Patent Document

Patent Document 1: Japanese Laid-open Publication No. 10-135315

SUMMARY

A test wafer according to an embodiment of the present disclosure is a test wafer used for simulation of heat emission of devices on a wafer, and includes a silicon wafer and a silicon heater bonded to a surface of the silicon wafer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
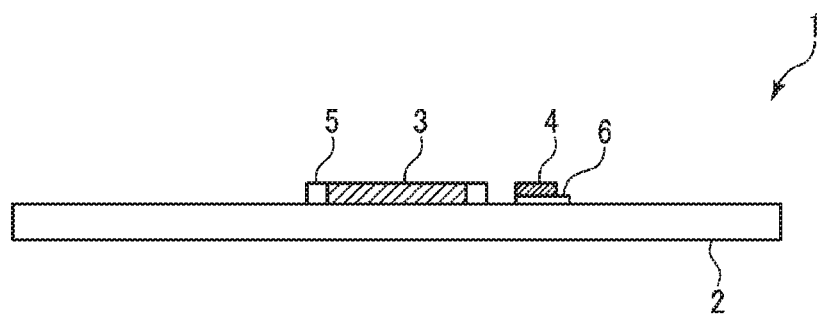
FIG. 1 is a cross-sectional view illustrating a wafer for a test according to an embodiment.

Hereinafter, embodiments will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Overview

For an inspection device for inspecting a device on a wafer, it is required to simulate an actual heat emission situation of an actual device. Further, it is also necessary to recognize which heat emission situation will occur when the actual device is actually operated.

Accordingly, it will be convenient if there is a test water (a jig wafer) which is used for simulating a heat emission situation of an actual device on a wafer, but such a test wafer is not present. Further, if a device is simulated by using a lithography technology of a semiconductor similarly to an actual device, costs of about tens of millions Yen and a manufacturing period of about half a year are necessary. Accordingly, the present inventor reviewed a test wafer usable for simulation of a heat emission situation of an actual device.

Because a circuit of an actual device is finely formed on a silicon wafer by a thin film, it has a very quick thermal response. Accordingly, when such a very quick thermal response is simulated by using a heater, the heater is required to have a low thermal capacity and a high thermal density. Further, considering that the heater is bonded to the silicon wafer to be used, the heater and the silicon wafer are required to have lower thermal resistances.

Conventionally used heaters include a polyimide heater, a silicon heater, and a mica heater. The polyimide heater and the silicon heater may have thin thicknesses of about 0.2 mm, but generally a heat resistant temperature of the heater is limited by a heat resistant property of an insulation material and thus the heat resistant temperature of the polyimide heater is 250 degrees C. and the heat resistant temperature of the silicon heater is 200 degrees C. which makes it difficult to achieve high density. Further, the heat resistant temperature of the mica heater is about 600 degrees C., but requires a thickness of about 1 mm due to a softness thereof, and it is difficult to achieve a high speed response due to an increased thermal capacity.

Accordingly, after a closer review, the present inventors have found that a silicon heater that takes silicon as a heat emitting body is effective as a heater usable for simulation of the thermal response of an actual device.

A specific resistance of silicon itself is about $1 \times 10^3$ Ω·cm, and a heat emission density of the heater is low. However, the specific resistance of silicon (silicon single crystal) doped with impurities may be set to about 0.2 Ω·cm by adjusting a doping material and a degree of doping, and insulation may be achieved by oxidizing a surface of silicon. Further, it is possible for silicon to have a thin thickness of 0.2 mm, and a thermal resistance between silicon wafers may be lowered. Accordingly, a silicon heater is suitable as a heater usable for simulation of a heat emission situation of an actual device, and a test wafer usable for simulation of a heat emission situation of an actual device may be realized by bonding the silicon heater to a silicon wafer.

Further, the above-described silicon heater uses a metal (for example, stainless steel (SUS), Ni, W, etc.) as a heat emitter, and uses a silicon resin (a polymer of siloxane) as an insulation material. In this aspect, the above-described silicon heater is different from the silicon heater of the present disclosure, which uses a silicon single crystal doped with a small amount of impurities as a heat emitter, and uses a silicon oxide obtained by oxidizing a surface of silicon as an insulation material.

<Test Wafer>

Hereinafter, an embodiment of a test wafer will be described.

FIG. 1 is a cross-sectional view illustrating a wafer for a test according to an embodiment.

The test wafer 1 is used for simulation of an actual wafer heat emission situation. The test wafer 1 has a silicon wafer 2, for example, of 300 mm, which acts as a base, and a silicon heater 3 bonded to a surface of the silicon wafer 2. A temperature monitor element 4 including a diode is bonded to a vicinity of the silicon heater 3 on the surface of the silicon wafer 2. However, the temperature monitor element 4 is not essential.

The silicon heater 3 is used for thermal simulation of a device that is actually formed in a wafer, and has a square shape or a rectangular shape. The size of the silicon heater 3 is properly set according to a target device. Further, it is preferable that the thickness of the silicon heater 3 is as thin as 0.1 mm to 0.5 mm such that the thermal capacity thereof becomes as small as possible, and for example, the thickness of the silicon heater 3 is about 0.2 mm.

Further, in FIG. 1, the bonding location of the silicon heater 3 is the center of the silicon wafer 2, but the present disclosure is not limited thereto. Further, the number of the silicon heaters 3 is not limited to one, but for example, in simulation for inspecting two or more devices at the same time by an inspection device for an actual wafer, the silicon heaters 3 corresponding to the number of the devices are formed.

A specific resistance of silicon is generally about $1 \times 10^3$ Ω·cm, and a heat emission density of the heater is low. However, a resistance of silicon may be set by doping impurities. When silicon is an N type semiconductor, for example, phosphorous and arsenic are doped. When silicon is a P type semiconductor, for example, boron and gallium are doped. A silicon wafer, the resistance of which is managed to, for example, about 0.2 Ω·cm, by doping the impurities in a silicon crystal growing step is prepared. And, as described above, the silicon heater 3 has square shape or a rectangular shape having a thin thickness of about 0.2 mm. The insulation of the silicon heater 3 is realized by forming a thermal oxide film on a surface of the silicon heater 3 by thermal oxidation processing.

An electrode 5 is formed at the silicon heater 3, and the silicon heater 3 emits heat as electric power is fed to the electrode 5. The heating temperature by the silicon heater 3 may be controlled based on the temperature measured by a diode that the temperature monitor element 4 includes. Further, the temperature monitor element 4 includes an electrode 6 of a diode.

The silicon heater 3 and the silicon wafer 2 that is a base may be bonded to each other by polishing bonding surfaces thereof, cleaning the bonding surfaces with a nitric acid, and bonding and heating the bonding surfaces. The bonding then may be diffusion bonding made by heating the bonding surface to 1000 degrees C., but the following method is preferable.

Figure 2A:
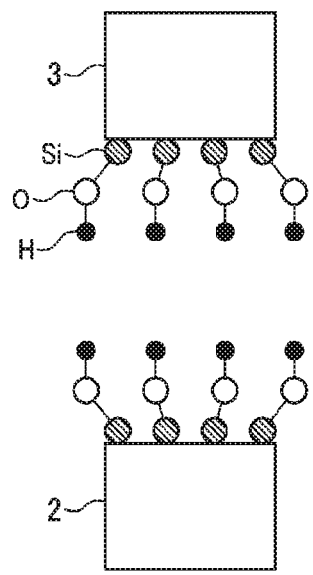
FIGS. 2A to 2D are diagrams illustrating an example of a method for manufacturing a wafer for a test.
Figure 2B:
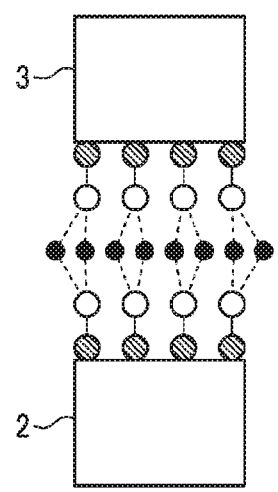
Figure 2C:
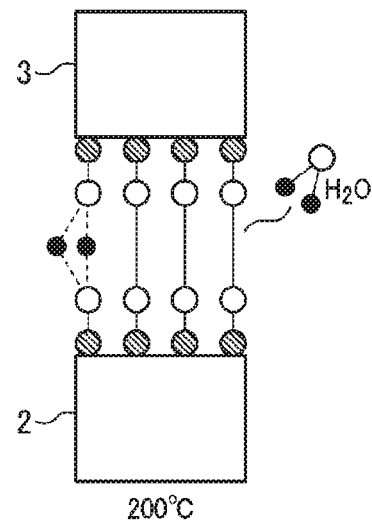
Figure 2D:
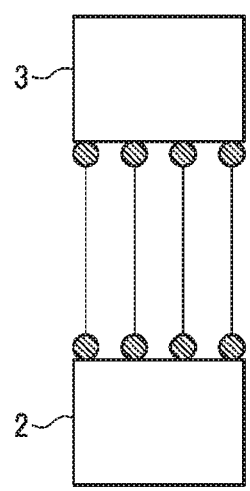

This method is a method of forming a covalent bond through a hydrogen bond by a hydroxyl group (—OH). For example, as illustrated in FIG. 2A, dangling bonds are formed by plasma processing the bonding surfaces of the silicon wafer 2 and the silicon heater 3, and the surfaces of the silicon wafer 2 and the silicon heater 3 are activated by generating a large amount of hydroxyl groups on the bonding surfaces thereof. Then, as illustrated in FIG. 2B, the silicon wafer 2 and the silicon heater 3 are put together, and are hydrogen bonded to each other through an OH radical. Then, as illustrated in FIG. 2C, a dehydration reaction is generated, for example, by heating the silicon wafer 2 and the silicon heater 3 at about 200 degrees C. And finally, as illustrated in FIG. 2D, both are bonded to each other by a covalent bond. Through the above-described method, the silicon wafer 2 and the silicon heater 3 may be bonded to each other at a low temperature of 200 degrees C. It is preferable that the heating temperature then is about 350 degrees C.

The covalent bond has a strong bonding force, and as in the diffusion bonding, the thermal conductivities of the silicon wafer 2 and the silicon heater 3 are about 168 W/m·K which is equivalent to a bulk state. Accordingly, the thermal resistances of the silicon wafer 2 and the silicon heater 3 can be made low. In this manner, a high-speed heat emission state that is similar to the case in which a device (a transistor circuit or the like) is formed on the silicon wafer 2 can be realized.

The test wafer 1 may be used for a jig wafer for verifying heat absorption characteristics of a stage device being configured to be heated and cooled and loading an actual wafer, in an inspection device that inspects electrical characteristics of the wafer.

Figure 3:
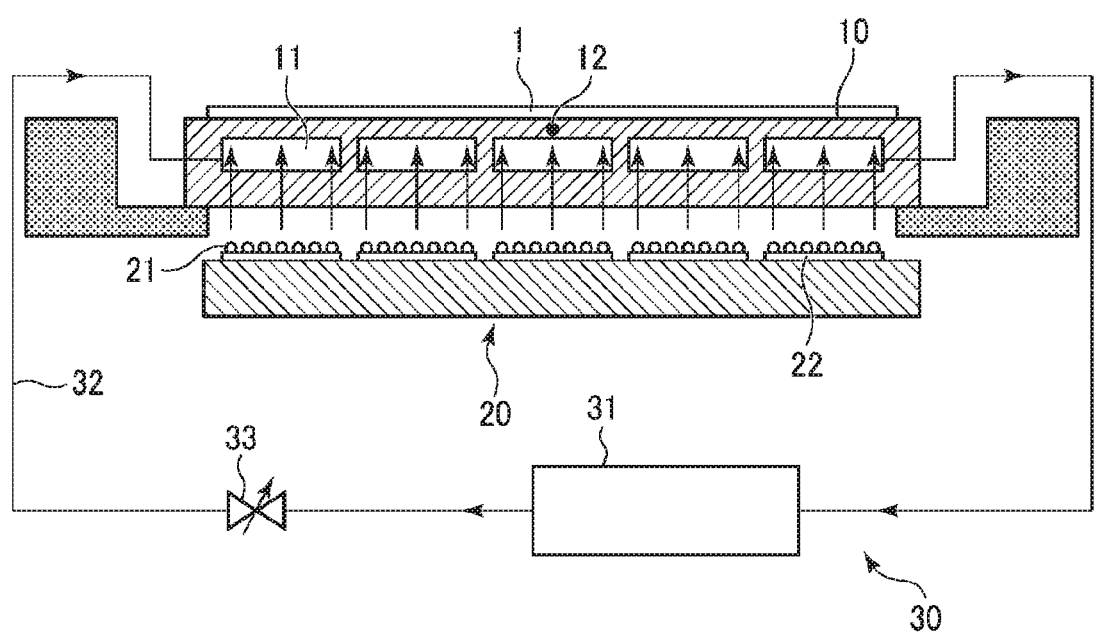
FIG. 3 is a cross-sectional view illustrating an example of a stage device in use for an inspection device capable of heating and cooling.

FIG. 3 is a cross-sectional view illustrating an example of a stage device in use for an inspection device, which may be heated or cooled. As illustrated in FIG. 3, the stage device includes a stage 10 configured to load a wafer, a heater 20 including a plurality of LEDs 21 configured to heat the wafer, and a cooler 30 configured to cool the stage 10. A refrigerant passage 11 is formed in the interior of the stage 10, and a temperature detecting thermocouple 12 is provided at the center of the upper surface of the stage 10. The heater 20 includes a plurality of LED units 22 each of which includes a unitized plurality of LEDs 21. For example, the plurality of LED units 22 are provided to correspond to the plurality of devices on the wafer. Electric power is fed from a power source (not illustrated) to the LEDs 21 of the LED units 22. The output from the power source is controlled by a controller (not illustrated). The cooler 30 causes to the refrigerant (for example, water) to flow through the refrigerant passage 11 of the stage 10 to absorb heat of the device formed in the wafer on the stage 10. The cooler 30 includes a chiller 31 configured to supply the refrigerant, a refrigerant pipeline 32 configured to circulate the refrigerant, and a valve 33 configured to adjust a flow rate. The flow rate of the refrigerant by the valve 33 is controlled by the controller (not illustrated).

Due to the high speed and high integration of ICs, the amount of emission heat of devices formed in wafers is increasing, and heat absorption of the devices during heat emission is becoming more and more important. The stage device of FIG. 3 may load the above-described test wafer 1 on the stage 10, may be used for simulation of a heat emission situation of an actual device during a test by using the silicon heater 3, and may verify the temperature controllability (heat absorption characteristics, etc.) of the stage 10. Accordingly, the evaluation of the inspection device and the evaluation of a test may be performed precisely.

In the verification (simulation), it is ideal to form a circuit pattern on a silicon wafer as in an actual circuit and use the heat emission, but much time and high costs are required for the manufacturing. In the premade heater, it is difficult to simulate heat emission of a high-end device in an aspect of power density and response speed. In contrast, in the test wafer according to the present embodiment, the heat emission behavior of the actual device may be simulated cost-efficiently and accurately.

Further, the test wafer 1 according to the present embodiment is not limited to the jig wafer for verifying heat absorption characteristics of the stage of the inspection device, and may be used for a test for recognizing a temperature applied to the device during the inspection.

Detailed Example

Next, a detailed example will be described.

After a high doping silicon wafer (phosphorus dope silicon wafer) was processed to have a predetermined shape, an electrode was formed and the silicon heater 3, the resistance of which was managed by a thickness of 0.2 mm (the resistance value of about 8Ω, and maximums of 10 A and 50 V were considered) was manufactured. The silicon heater 3 was bonded to the 300 mm silicon wafer 2, and the test wafer 1 was manufactured. Further, an electrode 6 was formed on the 300 mm silicon wafer 2, and a diode available on the market as a temperature monitor element 4 was bonded onto the electrode 6.

The details are as follows.

In the condition of the silicon heater 3, the voltage was 50 V and the maximum power was 600 W. First, the resistance of 300 W was obtained.

$$W=V^2/R \quad R=V^2/W=2500/300=8.33\,\Omega$$

Next, the resistance managing specific resistance ρ of the silicon heater 3 was calculated (20 mm square, the thickness t=0.2 mm).

$$\rho=R\times S/l=8.33\times 2\times 0.02/2=0.167\ \Omega\text{cm}$$

Figure 4:
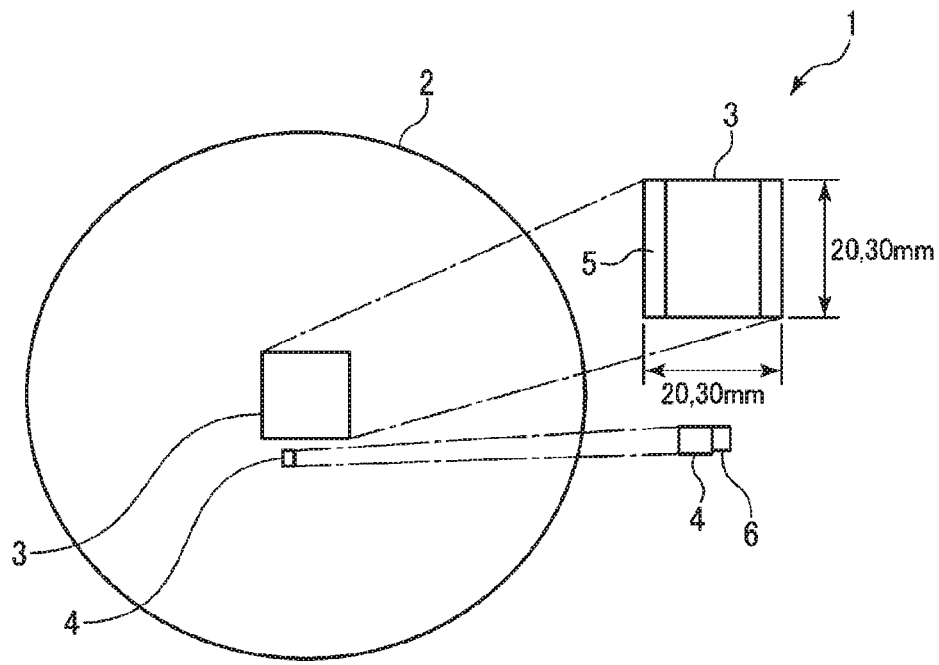
FIG. 4 is a plan view illustrating a detailed example of a wafer for a test.
Figure 5:
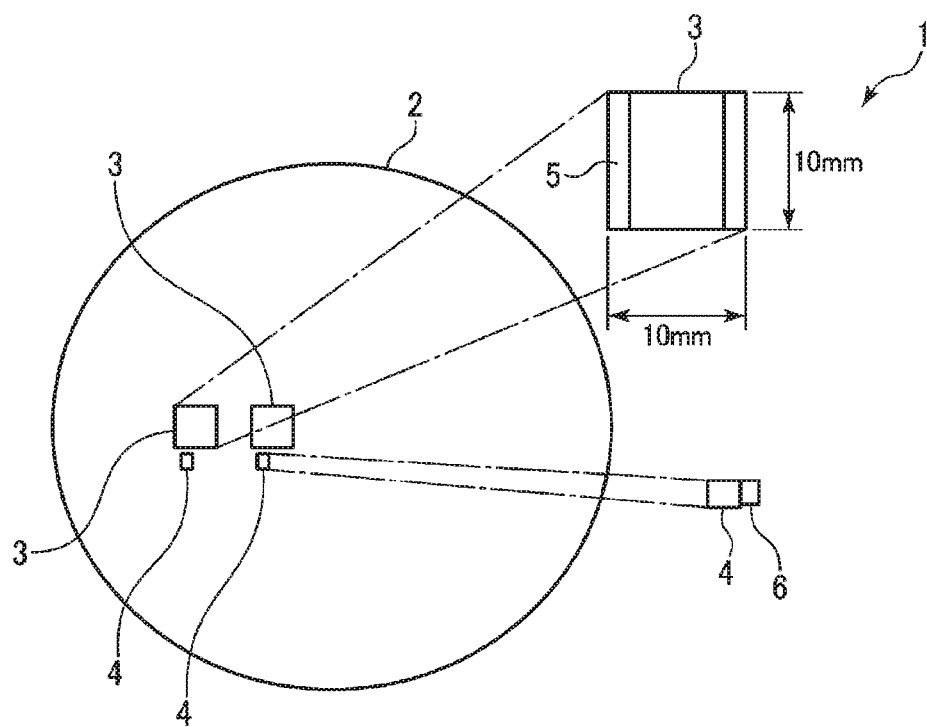
FIG. 5 is a plan view illustrating another detailed example of a wafer for a test.

The silicon heaters 3 of 20 mm square, 30 mm square, and 10 mm square were manufactured, and one silicon heater 3 of 20 mm square or 30 mm square, as illustrated in FIG. 4, was bonded to the center of the 300 mm wafer, and two silicon heaters 3 of 10 mm square, as illustrated in FIG. 5, were bonded to locations spaced apart from the center of the 300 mm wafer. Two silicon heaters of 10 mm square were provided because inspection of two devices was also considered during an inspection of devices if the size of the devices are small. Further, the silicon heaters of 10 mm square are disposed at the locations spaced apart from the center to monitor the behavior by the locational relationship with the thermocouple provided in the stage. The diode that is the temperature monitor element 4 is provided in the vicinity of the bonding location of the silicon heater 3, and the temperature of the silicon heater 3 is measured to be used for a temperature control of the silicon heater 3.

In the manufactured test wafer 1, the silicon heater 3 corresponds to the device of the actual wafer, and shows a thermal behavior that is similar to the device. By using the test wafer of the configuration as a stage jig wafer of the inspection device, the heat emission of an actual device may be simulated with a high precision, and the heat absorption characteristics of the stage may be precisely verified.

Other Applications

Although the embodiments have been described until now, the embodiments disclosed herein are illustrative, and is not restrictive. Omissions, replacements, and modifications may be made in various forms without departing from the scope of the attached claims and the spirits thereof.

For example, the shapes, the sizes, the arrangement locations, and the number of the silicon heater are simply illustrative in the detailed example of the embodiment, and are properly set according to the size, the arrangement, the amount of heat emission, and the inspection method of the device of the actual wafer, which is a target.

According to the present disclosure, a test wafer usable for simulation of heat emission of an actual device, and a method for manufacturing the same are provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A test wafer for simulation of heat emission of a device on a wafer, the test wafer comprising:
   a silicon wafer; and
   a silicon heater bonded to a region of a surface of the silicon wafer,
   wherein the test wafer is used as a jig wafer loaded on a stage of an inspection device for performing a wafer inspection to verify heat absorption characteristics of the stage.

2. The test wafer of claim 1, further comprising a temperature monitor element bonded to another region of the surface of the silicon wafer.

3. The test wafer of claim 2, wherein the silicon heater is formed of silicon doped with impurities such that a specific resistance of the silicon heater is lower than a specific resistance of silicon.

4. The test wafer of claim 3, wherein a thickness of the silicon heater ranges from 0.1 mm to 0.5 mm.

5. The test wafer of claim 4, wherein a power feeding electrode is formed at the silicon heater, and a thermal oxide film for insulation is formed on a surface of the silicon heater.

6. A test wafer for simulation of heat emission of a device on a wafer, the test wafer comprising:

a silicon wafer;

a silicon heater bonded to a region of a surface of the silicon wafer; and a temperature monitor element bonded to another region of the surface of the silicon wafer.

7. The test wafer of claim 6, wherein the silicon heater is formed of silicon doped with impurities such that a specific resistance of the silicon heater is lower than a specific resistance of silicon.

8. The test wafer of claim 6, wherein a thickness of the silicon heater ranges from 0.1 mm to 0.5 mm.

9. The test wafer of claim 6, wherein a power feeding electrode is formed at the silicon heater, and a thermal oxide film for insulation is formed on a surface of the silicon heater.

* * * * *